(12) United States Patent
Yamamuro et al.

(10) Patent No.: US 9,235,109 B2
(45) Date of Patent: Jan. 12, 2016

(54) LIGHT SOURCE DRIVING DEVICE, LIGHT SOURCE DRIVING METHOD, AND IMAGE DISPLAY DEVICE

(75) Inventors: Takahiko Yamamuro, Tokyo (JP); Shigeki Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 789 days.

(21) Appl. No.: 13/501,473

(22) PCT Filed: Oct. 18, 2010

(86) PCT No.: PCT/JP2010/068285
§ 371 (c)(1),
(2), (4) Date: Apr. 12, 2012

(87) PCT Pub. No.: WO2011/052418
PCT Pub. Date: May 5, 2011

(65) Prior Publication Data
US 2012/0206427 A1     Aug. 16, 2012

(30) Foreign Application Priority Data

Oct. 26, 2009   (JP) ................................. 2009-245803

(51) Int. Cl.
*G05F 1/00*      (2006.01)
*G03B 21/20*     (2006.01)
(Continued)

(52) U.S. Cl.
CPC ........ *G03B 21/2033* (2013.01); *G03B 21/2053* (2013.01); *G09G 3/3406* (2013.01); *H05B 33/0818* (2013.01); *H05B 33/0851* (2013.01); *G09G 3/2014* (2013.01); *G09G 2310/0235* (2013.01); *G09G 2310/066* (2013.01);

(Continued)

(58) Field of Classification Search
CPC ........... G03B 21/2033; G03B 21/2053; G09G 3/3406; H05B 33/0818; H05B 33/086; H05B 33/0851
USPC ....... 315/247, 224, 225, 185 S, 291, 307–326
See application file for complete search history.

(56) References Cited

U.S. PATENT DOCUMENTS 7,276,861 B1    10/2007  Shteynberg et al.
2001/0022613 A1  9/2001  Matsui et al.
(Continued)

FOREIGN PATENT DOCUMENTS

CN        1389964 A      1/2003
JP       62-130579 A     6/1987
(Continued)

*Primary Examiner* — Minh D A
*Assistant Examiner* — Borna Alaeddini
(74) *Attorney, Agent, or Firm* — Birch, Stewart, Kolasch & Birch, LLP

(57) ABSTRACT

A switching power source for driving a light emitting element, a pulse-drive switching element connected in parallel to the light emitting element, a photodetector for detecting an intensity of an output light output from the light emitting element, a current detecting element for detecting a current flowing from the switching power source, and an operation processing unit that controls an operation of the switching power source by performing a feedback loop operation based on a detection result from the photodetector and a feedback loop operation based on a detection result from the current detecting element are provided to stabilize an emission waveform even when the light emitting element is subjected to a pulsed emission.

6 Claims, 7 Drawing Sheets

(51) Int. Cl.
  *G09G 3/34* (2006.01)
  *H05B 33/08* (2006.01)
  *G09G 3/20* (2006.01)
  *H01S 5/042* (2006.01)
  *H01S 5/0683* (2006.01)
  *H01S 5/40* (2006.01)

(52) U.S. Cl.
  CPC ...... *G09G2320/064* (2013.01); *G09G 2330/02* (2013.01); *G09G 2330/025* (2013.01); *G09G 2360/145* (2013.01); *H01S 5/0428* (2013.01); *H01S 5/0683* (2013.01); *H01S 5/4087* (2013.01)

(56) References Cited

U.S. PATENT DOCUMENTS

| | | |
|---|---|---|
| 2003/0169226 A1 | 9/2003 | Yamada |
| 2008/0067942 A1 | 3/2008 | Watanabe et al. |
| 2008/0315773 A1 | 12/2008 | Pang |

FOREIGN PATENT DOCUMENTS

| | | | |
|---|---|---|---|
| JP | 6-275901 A | | 9/1994 |
| JP | 2007-65677 A | | 3/2007 |
| JP | 2009-123833 A | | 6/2009 |
| JP | 2009-141107 A | | 6/2009 |
| JP | 2009123833 A | * | 6/2009 |

* cited by examiner

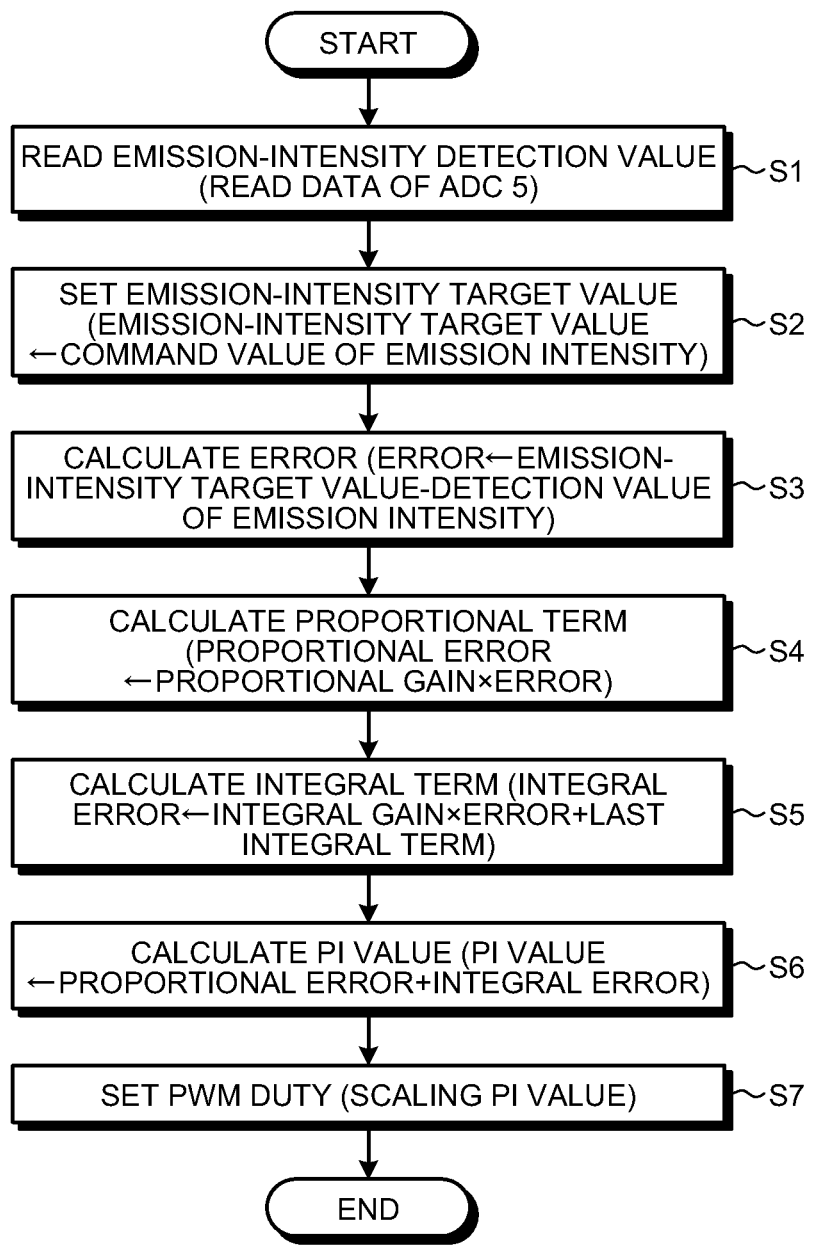

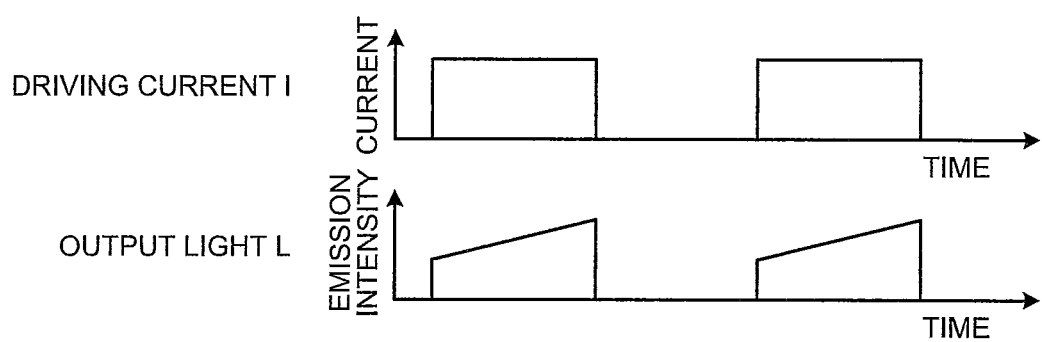
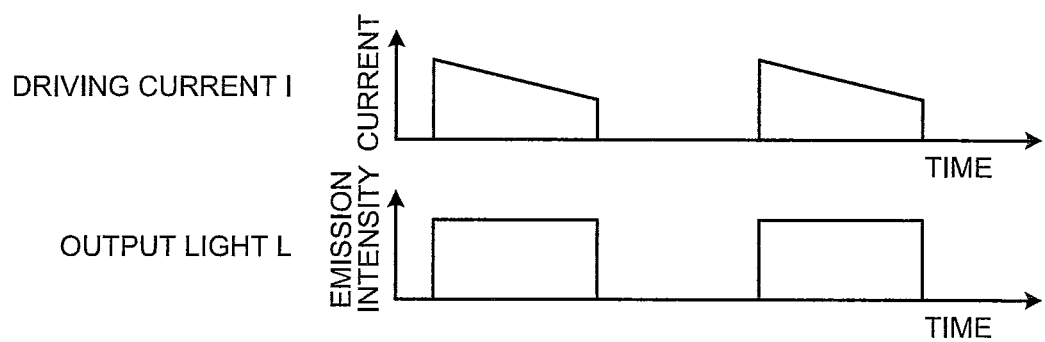
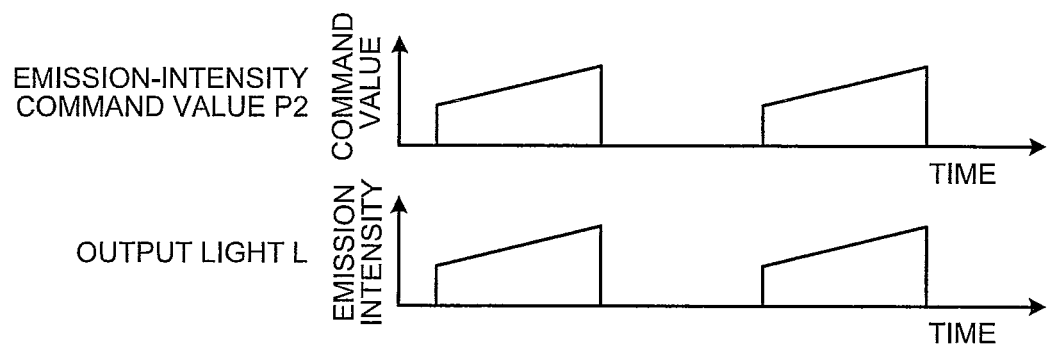

EMISSION-INTENSITY TARGET VALUE

DRIVING CURRENT I

OUTPUT LIGHT L

EMISSION-INTENSITY TARGET VALUE

DRIVING CURRENT I

OUTPUT LIGHT L

LIGHT SOURCE DRIVING DEVICE, LIGHT SOURCE DRIVING METHOD, AND IMAGE DISPLAY DEVICE

FIELD

The present invention relates to a light source driving device, a light source driving method, and an image display device.

BACKGROUND

Conventional projection televisions employ various types of lamps (white lamps such as a discharge xenon lamp, a metal halide lamp, or a halogen lamp) as their light sources, and spatial modulation devices such as a liquid crystal and a DMD (Digital Micromirror Device®) as their light bulbs. In recent years, a projection television employing a light emitting diode or a semiconductor laser is being put into production, aiming to obtain a long service life of the light source and an expansion of color reproduction range of an image.

In a projection television employing a light emitting diode or a semiconductor laser as the light source, a color image is obtained by driving light emitting elements each emitting a monochromatic light of red, green, or blue in such a manner that each of the light emitting elements emits a time-division pulsed light at such a high speed (a few hundred Hz to a few kHz) that the flickering is hardly perceived by human eyes. In addition, a projection television employing a DMD as the light bulb often uses a pulse-width modulation method as a gradation representing method, which represents the brightness with a length of a display time of each pixel (Patent Literature 1).

However, when representing the gradation by the pulse-width modulation method, an emission waveform from a light emitting element used as the light source needs to be a stable waveform without having a fluctuation between individual waveforms and a fluctuation due to a temperature change and a temporal change. Generally, it is possible to obtain a stable emission waveform with a constant emission intensity from a light emitting element such as a laser diode or a semiconductor laser by driving it with the rated current.

Furthermore, in a green region or a blue region, it is often the case that a sufficient light intensity can hardly be obtained only with a laser oscillation. Therefore, a technique of oscillating an infrared laser light, for example, and then converting the light into a visible light having a half wavelength is used, where the wavelength conversion is achieved by using a wavelength converting element such as an SHG (Second Harmonic Generation) element.

As a technique of controlling a light emitting element for a wavelength conversion using a wavelength converting element, there has been proposed a technique of measuring an emission intensity of a light from a semiconductor laser with a photodetecting element and controlling the light emitting element based on the measurement result (Patent Literature 2).

CITATION LIST

Patent Literatures

Patent Literature 1: Japanese Patent Application Laid-open No. 2007-65677

Patent Literature 2: Japanese Patent Application Laid-Open No. 2009-141107

SUMMARY

Technical Problem

However, some light emitting elements, the laser light of which is wavelength-converted using a wavelength converting element, cannot obtain a constant emission intensity when they are subjected to a pulsed emission even with the rated-current driving, and such elements may not be able to obtain a stable emission waveform. A possible reason for this can be factors such as a fluctuation in the characteristics of the wavelength converting element and a slight error generated at the time of assembling.

Furthermore, even with the light emitting diode or the semiconductor laser that can obtain a stable emission waveform by constant current driving, a peak value of the emission waveform can vary when it is driven to emit a pulsed light because the emission intensity is varied due to a temperature change or a temporal change.

Therefore, the conventional projection television has a problem that it is not possible to represent the gradation in a precise manner even when a semiconductor laser is used as the light source to achieve a long service life of the light source and an expansion of the color reproduction range of an image.

Further, in Patent Literature 2, a technique of controlling a light emitting element based on a result of measuring an emission intensity of a light from a semiconductor laser is described; however, there is no description of a light source driving device that can obtain a stable emission waveform when the light emitting element is subjected to a pulsed emission.

The present invention has been achieved in view of the above problems, and an object of the present invention is to provide a light source driving device, a light source driving method, and an image display device that can obtain a stable emission waveform even when a light emitting element is subjected to a pulsed emission.

Solution to Problem

In order to solve the aforementioned problems, a light source driving device according to one aspect of the present invention is configured to include: a switching power source for driving a light emitting element; a pulse-drive switching element connected in parallel to the light emitting element; a photodetector for detecting an intensity of an output light output from the light emitting element; a current detecting element for detecting a current flowing from the switching power source; and an operation processing unit that controls an operation of the switching power source by performing a feedback loop operation based on a detection result from the photodetector and a feedback loop operation based on a detection result from the current detecting element.

Advantageous Effects of Invention

According to the present invention, it is possible to stabilize an emission waveform even when a light emitting element is subjected to a pulsed emission.

BRIEF DESCRIPTION OF DRAWINGS

FIG. 4 is a flowchart of an operation process of an operation processing circuit 8 shown in FIG. 1 during an emission period.

FIG. 5 depict a relation between the driving current I of the light emitting element 2 and an emission waveform of the output light L when a laser diode with a wavelength converting element is used as the light emitting element 2 shown in FIG. 1.

FIG. 6 is an example of an emission-intensity command value P2 when the emission-intensity command value P2 is not constant and an example of an emission waveform of the output light L.

DESCRIPTION OF EMBODIMENTS

Exemplary embodiments of a light source driving device and an image display device according to the present invention will be explained below in detail with reference to the accompanying drawings. The present invention is not limited to the embodiments.

First Embodiment

Figure 1:
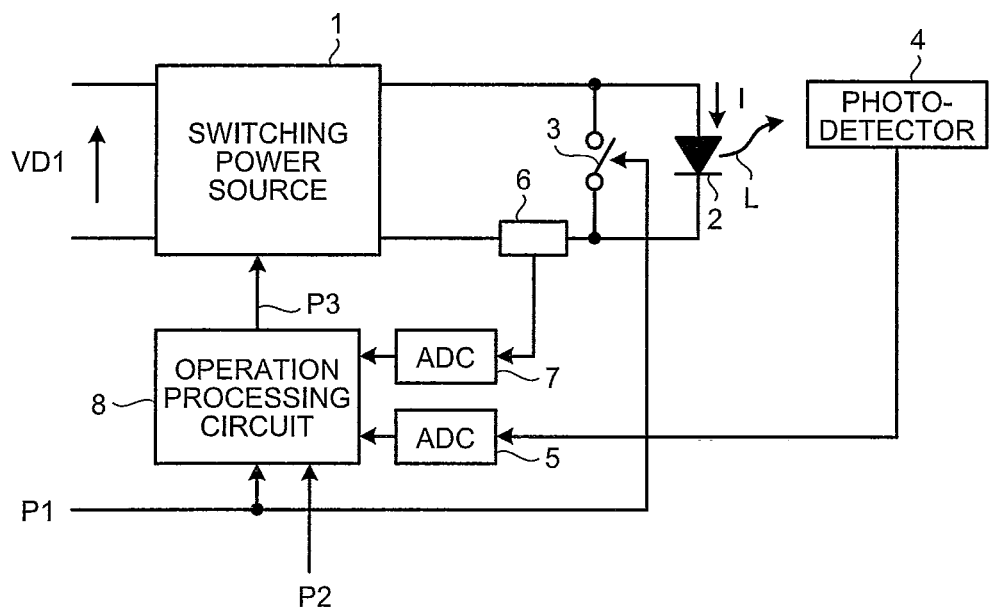
FIG. 1 is a block diagram of a schematic configuration of a light source driving device according to a first embodiment of the present invention.

FIG. 1 is a block diagram of a schematic configuration of a light source driving device according to a first embodiment of the present invention. In FIG. 1, a constant direct current (DC) voltage VD1 is input to a switching power source 1. A light emitting element 2 such as a light emitting diode or a semiconductor laser is connected to an output of the switching power source 1. The semiconductor laser may include a wavelength converting element that converts a wavelength of a laser light. Furthermore, the switching power source 1 can generate a driving current I for driving the light emitting element 2 based on a PWM signal P3 that is output from an operation processing circuit 8.

A pulse-drive switching element 3 is connected in parallel to the light emitting element 2. A semiconductor switch such as a field effect transistor or a bipolar transistor can be used as the pulse-drive switching element 3. The pulse-drive switching element 3 can drive the light emitting element 2 to emit a pulsed light by switching on and off based on a timing signal P1.

Furthermore, there is provided a photodetector 4 that detects an emission intensity of an output light from the light emitting element 2. As the photodetector 4 is used only to detect a relative emission intensity of the light from the light emitting element 2, the position of the photodetector 4 is not particularly limited. The photodetector 4 is a device that converts emission intensity into a voltage, which can be configured by, for example, an optical sensor such as a photodiode and an amplifier for amplifying a weak current from the optical sensor. An output of the photodetector 4 is input to an analog/digital converter (ADC) 5. Further, a current detecting element 6 is connected in series to the light emitting element 2 and the pulse-drive switching element 3. The current detecting element 6 is a device that converts a current into a voltage, which can be configured by, for example, a shunt resistor or a Hall element. An output of the current detecting element 6 is then input to an analog/digital converter (ADC) 7. When the output of the current detecting element 6 is weak, an amplifier can be arranged between the current detecting element 6 and the analog/digital converter 7.

An output of the analog/digital converter 5 and that of the analog/digital converter 7 are input to the operation processing circuit 8. The timing signal P1 for controlling an emission timing of the light emitting element 2 is input to the pulse-drive switching element 3 and the operation processing circuit 8. An emission-intensity command value P2 for determining the emission intensity of the light emitting element 2 can be set in the operation processing circuit 8 in advance, or can be set to the operation processing circuit 8 by an external control circuit (not shown).

The operation processing circuit 8 is configured to set an emission-intensity target value based on the emission-intensity command value P2, to calculate an error from the emission-intensity target value and the output of the analog/digital converter 5, to perform a feedback loop operation to reduce the error, and can output the pulse-width-modulated PWM signal P3 to the switching power source 1. At an initial stage of an emission period of the light emitting element 2, the emission-intensity target value may be set based on the rise-up characteristics of an emission of the light emitting element 2. Furthermore, the operation processing circuit 8 is configured to set a current target value in a non-emission period based on the output of the analog/digital converter 7 in an emission period, to calculate an error based on the current target value and the output value from the analog/digital converter 7, to perform a feedback loop operation to reduce the error, and to output the pulse-width-modulated PWM signal P3 to the switching power source 1. In this manner, the operation processing circuit 8 performs the feedback loop operation based on the output value from the analog/digital converter 5 during the emission period of the light emitting element 2 and performs the feedback loop operation based on the output value from the analog/digital converter 7 during the non-emission period of the light emitting element 2.

A microprocessor such as a microcomputer or a DSP (Digital Signal Processor) can be used for the operation processing circuit 8. Some microprocessors have an analog/digital converter incorporated therein, and in this case, the incorporated analog/digital converter of the microprocessor can be used as the analog/digital converters 5 and 7.

Figure 2:
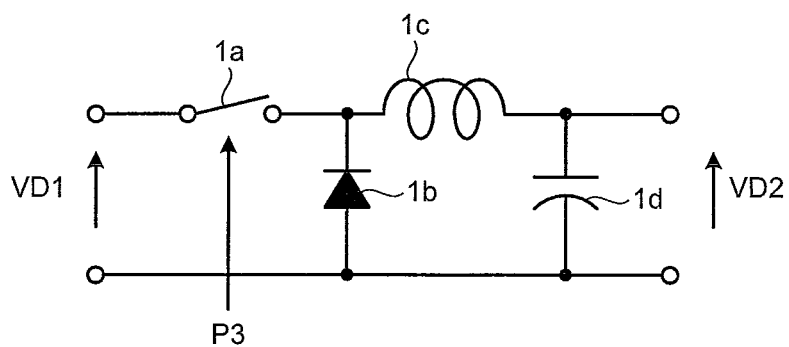
FIG. 2 is a circuit diagram of an example of a switching power source 1 shown in FIG. 1.

FIG. 2 is a circuit diagram of an example of the switching power source 1 shown in FIG. 1. As shown in FIG. 2, the switching power source 1 includes a power-source switching element 1a, a free wheel diode 1b, a choke coil 1c, and a smoothing condenser 1*d*, thereby to form a step-down DC/DC converter. The switching power source 1 can vary an output voltage VD2 based on the DC voltage VD1 by on/off controlling the power-source switching element 1*a* based on the PWM signal P3 that is input from the operation processing circuit 8. The DC voltage VD1 on which an on/off control is applied at the power-source switching element 1*a* is smoothed at the choke coil 1*c* and the smoothing condenser 1*d*, and the output voltage VD2 having only a little ripple is generated. The free wheel diode 1*b* is connected to an output of the power-source switching element 1*a* such that a current keeps on flowing even when the power-source switching element 1*a* is switched off. The system of the switching power source 1 is not particularly limited, and systems other than the step-down DC/DC converter can be used as long as the output voltage VD2 is made variable.

An operation according to the first embodiment is explained below in detail. As shown in FIG. 1, the DC voltage VD1 having a constant voltage is input to the switching power source 1. In this manner, the light emitting element 2 and the pulse-drive switching element 3 are connected to the switching power source 1 that can vary the output voltage VD2. In such a circuit configuration, when the pulse-drive switching element 3 is switched off, a current flows through the light emitting element 2, to thereby make the light emitting element 2 emit a light. When the pulse-drive switching element 3 is switched on, the current does not flow through the light emitting element 2, thus the light emission can be stopped.

In the circuit configuration described above, in order to prevent a large current from flowing through the pulse-drive switching element 3 when the pulse-drive switching element 3 is switched on, the smoothing condenser 1*d* of the switching power source 1 can be omitted, although this configuration slightly increases the ripple of the output voltage.

Figure 3:
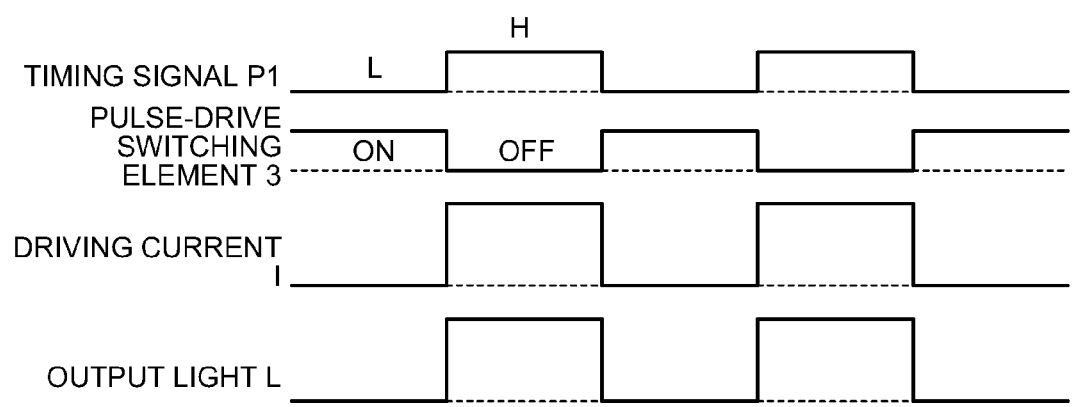
FIG. 3 is a waveform diagram of a relation among a timing signal P1, a state of a pulse-drive switching element 3, a driving current I flowing through a light emitting element 2, and an emission waveform of an output light L of the light source driving device shown in FIG. 1.

FIG. 3 is a waveform diagram showing a relation among the timing signal P1, a state of the pulse-drive switching element 3, the driving current I flowing through the light emitting element 2, and an emission waveform of an output light L of the light source driving device shown in FIG. 1. As shown in FIG. 3, for example, if the pulse-drive switching element 3 is switched off when the timing signal P1 is at a high level H, and is switched on when the timing signal P1 is at a low level L, then the current flows through the light emitting element 2 when the timing signal P1 is at the high level H, thus making the light emitting element 2 emit a light. On the other hand, when the timing signal P1 is at the low level L, the current flows through the pulse-drive switching element 3 and it does not flow through the light emitting element 2, thereby stopping the emission.

In this manner, by controlling on and off the pulse-drive switching element 3 based on the timing signal P1, it is possible to make the light emitting element 2 perform a pulsed light emission.

An operation of the operation processing circuit 8 is explained next. The output of the photodetector 4 is digitized by the analog/digital converter 5 and then input to the operation processing circuit 8. The output of the current detecting element 6 is digitized by the analog/digital converter 7 and then input to the operation processing circuit 8. The operation processing circuit 8 then performs an operation process while switching the output data from the analog/digital converter 5 and the output data from the analog/digital converter 7 according to the timing signal P1.

As an example, a process flow when a microcomputer is used as the operation processing circuit 8 is explained below in detail. The operation processing circuit 8 performs an operation process of a PI (Proportional Integral) control that is used in a feedback loop control. During the emission period of the light emitting element 2, the operation process of the PI control is performed based on the output data of the analog/digital converter 5, and during the non-emission period, the operation process of the PI control is performed based on the output data of the analog/digital converter 7. Switching between these two operation processes can be performed by inputting the timing signal P1 to an interrupt terminal of the microcomputer, that is, an interrupting process. Alternatively, the switching can be performed by a polling process by making a connection to an input/output terminal.

FIG. 4 is a flowchart of an operation process of the operation processing circuit 8 shown in FIG. 1 during a light emission period. As shown in FIG. 4, output data of the analog/digital converter 5 is read in as an emission-intensity detection value (Step S1). Subsequently, the emission-intensity command value P2 is set as an emission-intensity target value (Step S2). The difference between the emission-intensity target value and the emission-intensity detection value is then obtained as an error (Step S3). Subsequently, a product of a proportional gain (constant) and the error is obtained as a proportional error (Step S4). A product of in integral gain (constant) and the error is then obtained as an integral error. A sum of the integral error and the last integral error is obtained as an integral error (Step S5). Subsequently, a sum of the proportional error and the integral error is obtained as a PI value (Step S6). A duty of the PWM signal P3 is then determined by scaling the PI value with a predetermined value (Step S7). The operation process described above can be performed at a regular interval in synchronization with a carrier signal having the same frequency as a PWM signal P3 that is a base of the PWM signal P3, or in synchronization with an internal timer of the microcomputer, and the like.

The PWM signal P3 obtained from the above operation process is supplied to the switching power source 1. The switching power source 1 varies the output voltage VD2 according to the PWM signal P3 such that the emission intensity of the light emitting element 2 corresponds to the emission-intensity command value P2.

An operation process flow during the non-emission period of the light emitting element 2 is explained next. The basic operation process flow is the same as that shown in the flowchart of FIG. 4. Different points are a change of the detection value and values to be set for the target value, the proportional gain, and the integral gain. The detection value is a current detection value from the analog/digital converter 7, and values optimized for the control loop during non-emission period are set to the proportional gain and the integral gain. Furthermore, it is desirable to set a substantially same current value as the driving current I flowing through the light emitting element 2 during the emission period for the target value.

By setting a substantially same value as the current value flowing through the light emitting element 2 during the emission period for the current target value, it is possible to reduce the fluctuation of a current flowing through the light emitting element 2 when switching from the non-emission period to the emission period, thereby to stabilize a light emission at the initial stage of emission. If a value larger than the current value of the emission period is set to the current target value, a large current flows through the light emitting element 2 at an initial stage of the emission, and this possibly causes an abnormal emission. On the other hand, if a value smaller than the current value of the emission period is set to the current target value, the driving current I at the initial stage of the emission is decreased, and it may take some time for the emission to be stabilized. The current value flowing through the light emitting element 2 during the emission period can be measured at any time by sampling the data of the analog/digital converter 7. Although data at an arbitrary point sampled during the emission period can be used as the value to be set to the current target value, an average value of a plurality of arbitrary data points, or an average value of the whole data can be also used. Alternatively, a value obtained by performing an appropriate operation process on these values can be used as the value to be set to the current target value.

In the above explanations, although the feedback loop control operation is performed as the operation process of only the PI term, an operation process including a differential term can be also used.

In this manner, by setting a substantially same value as the current value flowing through the light emitting element 2 during the emission period as the current target value, it is possible to reduce the fluctuation of a current flowing through the light emitting element 2 when switching from the non-emission period to the emission period, so that it is possible to suppress an abnormal emission or a delay of the emission at the initial stage of the emission.

Next, an emission waveform obtained when the light emitting element 2 in which its driving current and emission intensity are not in a proportional relation is driven by the light source driving device is explained.

FIGs. 5A and 5B depict a relation between the driving current I of the light emitting element 2 and an emission waveform of the output light L when a laser diode having a wavelength converting element is used as the light emitting element 2 shown in FIG. 1. FIG. 5A depicts an emission waveform when the light emitting element 2 is subjected to the rated-current driving, and FIG. 5B is an emission waveform when the light emitting element 2 is driven by the light source driving device shown in FIG. 1.

In FIGs. 5A and 5B, although the laser diode having a wavelength converting element basically has a proportional relation between the driving current I and the emission intensity of the output light L, according to individual devices, when it is driven with the rated-current, some may require a time of about a few hundred microseconds to a few milliseconds until the emission intensity is set to a steady level. When such a laser diode is pulse-driven so that an emission period becomes about a few hundred microseconds, the rated-current driving shows a steadily increasing emission waveform as shown in FIG. 5A.

On the other hand, using the light source driving device shown in FIG. 1, even with such a laser diode, it is possible to generate an emission waveform with a constant emission intensity by setting the emission-intensity command value P2 during the emission period to be a constant value as shown in FIG. 5B. When driving such a laser diode, it is desirable to speed up the response characteristic of the feedback loop control in some cases in order to make the emission intensity of the output light L constant, and therefore there are cases where it is necessary to optimize the proportional gain and the integral gain.

Meanwhile, because a light emitting diode or a laser diode without a wavelength converting element substantially has a proportional relation between the driving current I and the emission intensity of the output light L and has also a fast response speed, it is possible to obtain an emission waveform with a substantially constant emission intensity by driving with the rated current even when it is subjected to a pulsed emission. However, even such a light emitting diode or laser diode can have a problem such that a fluctuation occurs in the emission intensity among individual devices under the rated-current driving or the emission intensity varies due to a temperature change. Nevertheless, even in such a case, it is possible to improve the state of the fluctuation of the emission intensity among the individual light emitting diodes or laser diodes, or the variation of the emission intensity due to a temperature change by using the light source driving device shown in FIG. 1.

As described above, according to the first embodiment, because both the emission intensity of the light emitting element 2 used for the light source and the current (an output of the current detecting element 6) flowing from the switching power source 1 is fed back to the operation processing circuit 8, the feedback loop operation is performed based on the emission intensity during the emission period and the feedback loop operation is performed based on the current flowing from the switching power source 1 during the non-emission period, it is possible to obtain a stable emission waveform with a constant emission intensity when the light emitting element 2 is subjected to a pulsed-light driving.

Although the above explanations have described a case of obtaining an emission waveform with a constant emission intensity during the emission period, that is, the emission-intensity command value P2 is constant within the emission period, the emission-intensity command value P2 within the emission period is not necessarily to be constant, and can be variable. In the case of using variable, it is possible to change the emission waveform according to the emission-intensity command value P2.

FIG. 6 is an example of the emission-intensity command value P2 when the emission-intensity command value P2 is not constant, and an emission waveform of the output light L. As shown in FIG. 6, for example, when the emission-intensity command value P2 is set to a value that increases along with an emission time, the emission waveform is also changed such that the emission intensity increases with the lapse of time.

An initial state of the emission period, that is, a rising waveform of the emission waveform is explained next in detail.

Figure 7:
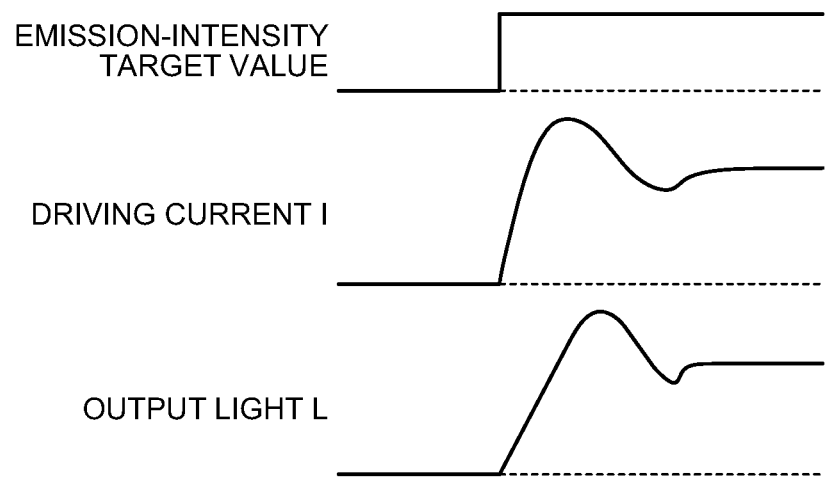
FIG. 7 depicts a relation among an emission-intensity target value of the light emitting element 2 at an initial stage of emission, the driving current I, and an emission waveform of the output light L when the emission-intensity target value is constant.

FIG. 7 depicts a relation among an emission-intensity target value of the light emitting element 2 at an initial stage of emission, the driving current I, and an emission waveform of the output light L when the emission-intensity target value is constant.

As shown in FIG. 7, a current flows through the light emitting element 2 abruptly (rising time: about a few hundred nanoseconds) by switching off the pulse-drive switching element 3 connected in parallel to the light emitting element 2. Although a time from the current flows until the light emitting element 2 emits a light is generally about a few hundred nanoseconds, in the laser diode using a wavelength converting element, a time of about a few microseconds is occasionally required until the emission due to a fluctuation in the characteristics of the wavelength converting element and a slight error generated at the time of assembling.

When the emission-intensity target value is set to a constant value from the initial stage of switching to the emission period for such a light emitting element 2, an error between the emission-intensity target value and the emission-intensity detection value is made large due to a delay of the emission, and therefore the PI value increases and the output voltage VD2 of the switching power source 1 increases. As a result, a large driving current I temporarily flows through the light emitting element 2 at the initial stage of the emission period, to cause an overshoot to the emission waveform, and finally become a stable level with the lapse of time. Such a state may cause the driving current I and the emission intensity of the light emitting element 2 to be higher than rated values, which results in a degradation of the reliability.

Therefore, the emission-intensity target value of the feedback loop operation performed at the operation processing circuit 8 may be set to a small value at the initial stage of the emission period and then it may be varied to increase with the lapse of time. The emission-intensity target value can be set to change with the lapse of time such that a period in which the error between the emission-intensity target value and the emission-intensity detection value is made larger than a predetermined value (for example, a half of the emission-intensity command value) becomes equal to or shorter than a predetermined period. The predetermined value and the predetermined period are determined not to generate an overshoot from the rise-up characteristics of the emission of the light emitting element and the control characteristic of the feedback control system. The predetermined value can be set to decrease as the emission-intensity detection value approaches the emission-intensity target value.

Figure 8:
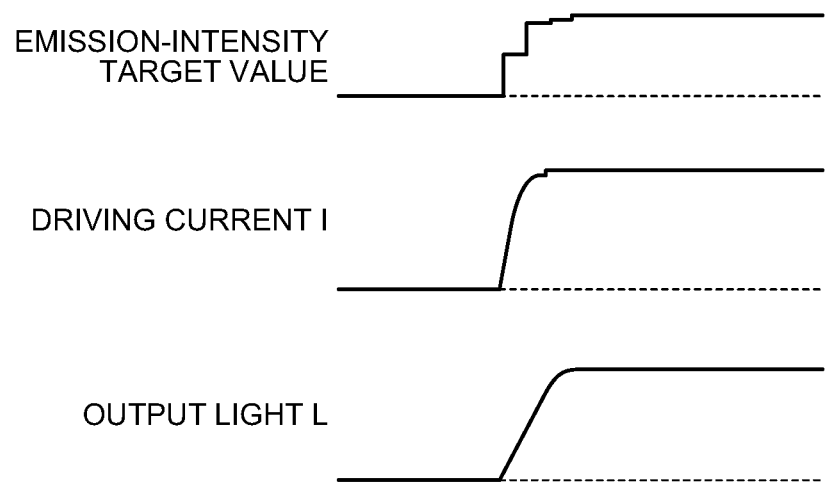
FIG. 8 depicts a relation among an emission-intensity target value of the light emitting element 2 at an initial stage of emission, the driving current I, and the emission waveform of the output light L when the emission-intensity target value is changed.

FIG. 8 depicts a relation among an emission-intensity target value of the light emitting element 2 at an initial stage of emission, the driving current I, and the emission waveform of the output light L when the emission-intensity target value is changed. In FIG. 8, when the emission-intensity command value P2 at a steady state is set to Pa, the emission-intensity target value is changed to 0.5×Pa, 0.9×Pa, and 0.95×Pa every time the operation process is performed at the initial stage of the emission period. By changing the emission-intensity target value in this manner, it is made possible to reduce the error between the emission-intensity target value and the emission-intensity detection value even when there is a delay of the emission, and because the PI value is not increased, a large current does not flow at the initial stage of the emission, thereby making it possible to suppress an overshoot of the emission waveform.

As described above, by setting the emission-intensity target value of the feedback loop operation performed at the operation processing circuit 8 based on the emission characteristic of the light emitting element 2 at the initial state of the emission, it is made possible to suppress an overshoot of the emission waveform at the initial stage of the emission, thereby making it possible to enhance the reliability of the light emitting element 2.

Second Embodiment

Figure 9:
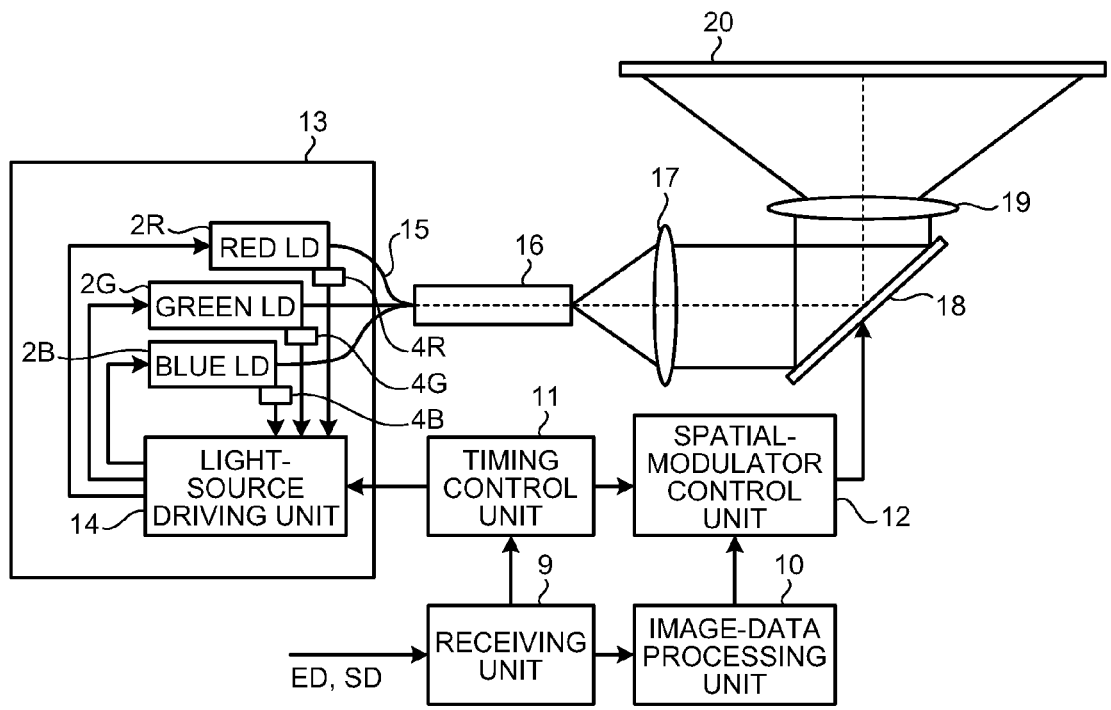
FIG. 9 is a block diagram of a schematic configuration of an image display device having a light source driving device according to a second embodiment of the present invention incorporated therein.

FIG. 9 is a block diagram of a schematic configuration of an image display device having a light source driving device according to a second embodiment of the present invention incorporated therein. As shown in FIG. 9, the image display device includes a light source unit 13 that includes a red light emitting element 2R, a green light emitting element 2G, a blue light emitting element 2B, and a light-source driving unit 14. As the red light emitting element 2R, the green light emitting element 2G, and the blue light emitting element 2B, for example, a light emitting diode or a laser diode can be used, and the laser diode can include a wavelength converting element. The light-source driving unit 14 can drive the red light emitting element 2R, the green light emitting element 2G, and the blue light emitting element 2B.

Image data ED and a synchronization signal SD are input to a receiving unit 9 from an external video device. The image data ED input to the receiving unit 9 is supplied to an image-data processing unit 10. The image data supplied to the image-data processing unit 10 is input to a spatial-modulator control unit 12. The synchronization signal SD input to the receiving unit 9 is input to a timing control unit 11 as a timing signal. The timing signal is supplied to the spatial-modulator control unit 12 and the light-source driving unit 14 of the light source unit 13 from the timing control unit 11.

The image data to be displayed is supplied to a light bulb 18 from the spatial-modulator control unit 12. Currents for driving the red light emitting element 2R, the green light emitting element 2G, and the blue light emitting element 2B are supplied from the light-source driving unit 14. Output lights output from the red light emitting element 2R, the green light emitting element 2G, and the blue light emitting element 2B sequentially pass through an optical fiber 15, a light collecting tube 16, a lens 17, the light bulb 18, and a lens 19 and reach a screen 20. Furthermore, photodetectors 4R, 4G, and 4B are respectively arranged between each of the red light emitting element 2R, the green light emitting element 2G, and the blue light emitting element 2B and the optical fiber 15 to detect leakage light from the red light emitting element 2R, the green light emitting element 2G, and the blue light emitting element 2B, which are connected to the light-source driving unit 14.

Figure 10:
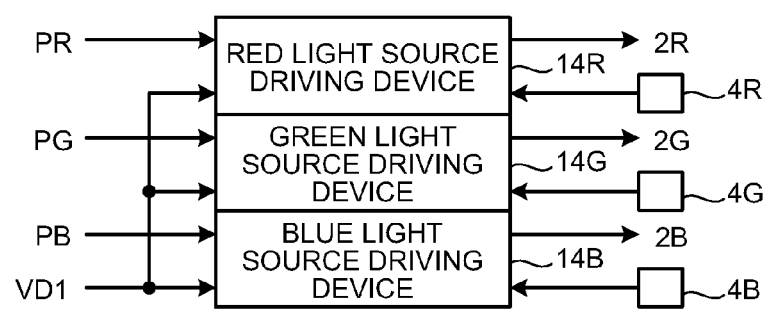
FIG. 10 is a block diagram of an example of a schematic configuration of a light-source driving unit 14 shown in FIG. 9.

FIG. 10 is a block diagram of an example of a schematic configuration of the light-source driving unit 14 shown in FIG. 9. As shown in FIG. 10, the light-source driving unit 14 includes a red light source driving device 14R for driving the red light emitting element 2R, a green light source driving device 14G for driving the green light emitting element 2G, and a blue light source driving device 14B for driving the blue light emitting element 2B. As the red light source driving device 14R, the green light source driving device 14G, and the blue light source driving device 14B, a configuration obtained by removing the photodetector 4 from the light source driving device shown in FIG. 1 can be used. Although the light source driving device similar to the one shown in FIG. 1 can be used as the red light source driving device 14R, the green light source driving device 14G, and the blue light source driving device 14B, it is also acceptable to drive the red light emitting element 2R, the green light emitting element 2G, and the blue light emitting element 2B that use wavelength converting elements by the light source driving device similar to the one shown in FIG. 1, and drive other red light emitting element 2R, green light emitting element 2G, and blue light emitting element 2B by a rated-current light source driving device.

The photodetectors 4R, 4G, and 4B are connected to the red light source driving device 14R, the green light source driving device 14G, and the blue light source driving device 14B, and a red timing signal PR, a green timing signal PG, and a blue timing signal PB are respectively input. Furthermore, although not shown in the drawings, the constant DC voltage VD1 converted from a commercial power source by an AC/DC (alternate current/direct current) converting circuit in the image display device is supplied to the red light source driving device 14R, the green light source driving device 14G, and the blue light source driving device 14B. The emission-intensity command value P2 can be set in the red light source driving device 14R, the green light source driving device 14G, and the blue light source driving device 14B in advance. Alternatively, the emission-intensity command value P2 can be set by a control circuit (not shown) installed in the image display device.

An operation according to the present embodiment is explained below in detail. As shown in FIG. 9, the image data ED input to the receiving unit 9 is supplied to the image-data processing unit 10. At the image-data processing unit 10, the image data ED that is Gamma-corrected according to characteristics of a CRT is inverse Gamma-corrected such that a relation between the image data ED and brightness becomes linear. Thereafter, at the image-data processing unit 10, a pulse-width modulation process of varying an emission time of each pixel according to a gradation of the image data ED is performed based on the inverse Gamma-corrected image data ED. The pulse-width-modulated image data ED is supplied to the spatial-modulator control unit 12. At the spatial-modulator control unit 12, a signal for controlling on and off of a pixel of the light bulb 18 is output based on the pulse-width-modulated image data ED. At the light bulb 18, an input light is spatially modulated such that a pixel with a long on-time becomes bright and a pixel with a short on-time becomes dark.

The synchronization signal SD input to the receiving unit 9 is supplied to the timing control unit 11 as a timing signal. At the timing control unit 11, the red timing signal PR, the green timing signal PG, and the blue timing signal PB are supplied to the spatial-modulator control unit 12 and the light-source driving unit 14 such that the image data ED supplied from the spatial-modulator control unit 12 to the light bulb 18 is synchronized with timings at which the light-source driving unit 14 drives the red light emitting element 2R, the green light emitting element 2G, and the blue light emitting element 2B.

The light-source driving unit 14 sequentially drives the red light emitting element 2R, the green light emitting element 2G, and the blue light emitting element 2B in accordance with the red timing signal PR, the green timing signal PG, and the blue timing signal PB, respectively. As a result, the red light emitting element 2R, the green light emitting element 2G, and the blue light emitting element 2B sequentially emit lights in synchronization with the red timing signal PR, the green timing signal PG, and the blue timing signal PB, respectively.

The lights output from the red light emitting element 2R, the green light emitting element 2G, and the blue light emitting element 2B pass through the optical fiber 15, and are collected into a single flux at the light collecting tube 16. The lights collected into a single flux pass through the lens 17, with which the light bulb 18 is illuminated. At the light bulb 18, the illuminated lights are on-off controlled based on the image data supplied from the spatial-modulator control unit 12. In an on-period, the illuminated lights are spatially modulated to pass the lens 19 and arrive at the screen 20, and in an off-period, the illuminated lights are spatially modulated not to pass the lens 19 and arrive at the screen 20. In this manner, the lights spatially modulated at the light bulb 18 based on the image data ED are projected on the screen 20, and are then displayed as an image.

Figure 11:
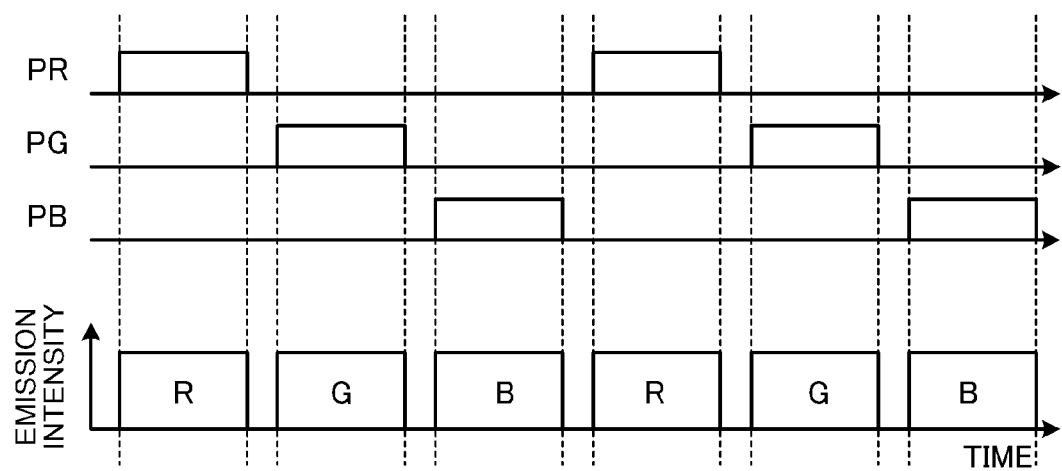
FIG. 11 depicts a relation among a red timing signal PR, a green timing signal PG, and a blue timing signal PB and emission waveforms of a red light emitting element 2R, a green light emitting element 2G, and a blue light emitting element 2B.

FIG. 11 depicts a relation among the red timing signal PR, the green timing signal PG, and the blue timing signal PB and emission waveforms of the red light emitting element 2R, the green light emitting element 2G, and the blue light emitting element 2B. As shown in FIG. 11, the red light emitting element 2R, the green light emitting element 2G, and the blue light emitting element 2B are sequentially driven to emit a light in a time-division manner in synchronization with the red timing signal PR, the green timing signal PG, and the blue timing signal PB. The image data of each color is then supplied from the spatial-modulator control unit 12 to the light bulb 18 in synchronization with emission periods of the red light emitting element 2R, the green light emitting element 2G, and the blue light emitting element 2B, so that an image corresponding to the image data of each color is displayed in a time-division manner on the screen 20. Although the image of each color is sequentially displayed on the screen 20 in a time-division manner, because the display cycle is high (several hundred Hz to several kHz), it is recognized as a color image by a viewer naturally due to an afterimage effect of eyes.

In the image display device described above, a pulse-width modulation method is used as the method of representing the gradation of the image data. When representing the gradation by the pulse-width modulation method, in order to represent the gradation in an accurate manner, it is required that an amplitude, that is, the emission intensity of the light emitting element needs to be stable. If the emission intensity is not stable, the gradation is not represented accurately, resulting in a phenomenon such as gradation jump. As a result, when an image in which a gradation is changed in a subtle way is displayed, a trouble occurs, such as a generation of a false color. In the pulse-width modulation method, if there is no fluctuation of the emission waveform between the individual light emitting elements of the same color and no variation of the emission waveform due to a temperature change or a temporal change, the emission intensity during the emission period is not necessarily to be constant, and can be any arbitrary waveform.

By providing the light source driving device shown in FIG. 1 for the light source unit 13 in the image display device described above and driving the red light emitting element 2R, the green light emitting element 2G, and the blue light emitting element 2B, it is possible to obtain a stable emission waveform in which there is no fluctuation of the emission waveform between the individual red light emitting elements 2R, green light emitting elements 2G, and blue light emitting elements 2B of the same color and no variation of the emission waveform due to a temperature change or a temporal change. As a result, it is possible to represent the gradation of the image display device in an accurate manner.

INDUSTRIAL APPLICABILITY

As described above, the light source driving device according to the present invention can obtain a stable emission waveform even when a light emitting element is subjected to a pulsed emission, and is suitable for a method for representing a gradation of a projection television using a semiconductor laser as a light source with high precision.

REFERENCE SIGNS LIST

1 SWITCHING POWER SOURCE
1a POWER-SOURCE SWITCHING ELEMENT
1b FREE WHEEL DIODE
1c CHOKE COIL
1d SMOOTHING CONDENSER
2 LIGHT EMITTING ELEMENT
2R RED LIGHT EMITTING ELEMENT
2G GREEN LIGHT EMITTING ELEMENT
2B BLUE LIGHT EMITTING ELEMENT
3 PULSE-DRIVE SWITCHING ELEMENT
4, 4R, 4G, 4B PHOTODETECTOR
5, 7 ANALOG/DIGITAL CONVERTER
6 CURRENT DETECTING ELEMENT
8 OPERATION PROCESSING CIRCUIT
9 RECEIVING UNIT
10 IMAGE-DATA PROCESSING UNIT
11 TIMING CONTROL UNIT
12 SPATIAL-MODULATOR CONTROL UNIT
13 LIGHT SOURCE UNIT
14 LIGHT-SOURCE DRIVING UNIT
14R RED LIGHT SOURCE DRIVING DEVICE
14G GREEN LIGHT SOURCE DRIVING DEVICE
14B BLUE LIGHT SOURCE DRIVING DEVICE
15 OPTICAL FIBER
16 LIGHT COLLECTING TUBE
17 LENS
18 LIGHT BULB
19 LENS
20 SCREEN

The invention claimed is:

1. A light source driving device comprising:
   a switching power source for driving a light emitting element;
   a pulse-drive switching element connected in parallel to the light emitting element;
   a photodetector for detecting an intensity of an output light output from the light emitting element;
   a current detecting element for detecting a current flowing from the switching power source; and
   an operation processing unit that controls an operation of the switching power source by performing a feedback loop operation based on a detection result from the photodetector and a feedback loop operation based on a detection result from the current detecting element,
   wherein the operation processing unit controls operation of the switching power source by switching between the feedback loop operation based on the detection result from the photodetector and the feedback loop operation based on the detection result from the current detecting element based on a timing signal for switching on and off the pulse-drive switching element, and
   the operation processing unit perfoiins the feedback loop operation based on the detection result from the photodetector during an emission period of the light emitting element and performs the feedback loop operation based on the detection result from the current detecting element during a non-emission period of the light emitting element.

2. The light source driving device according to claim 1, wherein the operation processing unit performs the feedback loop operation such that the detection result of the photodetector approaches an emission-intensity target value.

3. The light source driving device according to claim 1, wherein a current target value of the feedback loop operation based on the detection result from the current detecting element is set based on the detection result of the current detecting element in an emission period of the light emitting element.

4. The light source driving device according to claim 1, wherein an emission-intensity target value of the feedback loop operation based on the detection result from the photodetector is set to a small value at an initial stage of an emission period of the light emitting element and is varied to increase with the lapse of time.

5. An image display device equipped with a light source driving device, the light source driving device comprising;
   a light emitting element driven by the light source driving device;
   a switching power source for driving the light emitting element;
   a pulse-drive switching element connected in parallel to the light emitting element;
   a photodetector for detecting an intensity of an output light output from the light emitting element;
   a current detecting element for detecting a current flowing from the switching power source;
   an operation processing unit that controls an operation of the switching power source by performing a feedback loop operation based on a detection result from the photodetector and a feedback loop operation based on a detection result from the current detecting element, and
   a timing control unit that controls a timing of a pulsed emission of the light emitting element, wherein
   wherein the operation processing unit controls operation of the switching power source by switching between the feedback loop operation based on the detection result from the photodetector and the feedback loop operation based on the detection result from the current detecting element based on a timing signal for switching on and off the pulse-drive switching element, and
   the operation processing unit performs the feedback loop operation based on the detection result from the photodetector during an emission period of the light emitting element and performs the feedback loop operation based on the detection result from the current detecting element during a non-emission period of the light emitting element.

6. A light source driving method comprising:
   a step of controlling a driving current of a light emitting element that is subjected to a pulsed emission during an emission period of the light emitting element based on a feedback loop operation based on an intensity of an output light output from the light emitting element; and
   a step of controlling a current during a non-emission period of the light emitting element based on a feedback loop operation based on a current flowing from a switching power source for driving the light emitting element that is subjected to the pulsed emission.

* * * * *